(12) United States Patent
Eendebak et al.

(10) Patent No.: US 12,289,912 B2
(45) Date of Patent: Apr. 29, 2025

(54) SEMICONDUCTOR ELEMENT, METHOD OF READING OUT A QUANTUM DOT DEVICE AND SYSTEM

(71) Applicant: Nederlandse Organisatie voor toegepast-natuurwetenschappelijk onderzoek TNO, 's-Gravenhage (NL)

(72) Inventors: Pieter Thijs Eendebak, Utrecht (NL); Nodar Samkharadze, Delft (NL)

(73) Assignee: Nederlandse Organisatie voor toegepast-natuurwetenschappelijk onderzoek TNO, 's-Gravenhage (NL)

( * ) Notice: Subject to any disclaimer, the term of this patent is extended or adjusted under 35 U.S.C. 154(b) by 516 days.

(21) Appl. No.: 17/631,305

(22) PCT Filed: Aug. 7, 2020

(86) PCT No.: PCT/NL2020/050501
§ 371 (c)(1),
(2) Date: Jan. 28, 2022

(87) PCT Pub. No.: WO2021/025558
PCT Pub. Date: Feb. 11, 2021

(65) Prior Publication Data
US 2022/0320291 A1    Oct. 6, 2022

(30) Foreign Application Priority Data
Aug. 7, 2019   (EP) .................... 19190531

(51) Int. Cl.
*H01L 29/12*    (2006.01)
*H10D 48/00*    (2025.01)
*H10D 62/81*    (2025.01)

(52) U.S. Cl.
CPC ......... *H10D 62/814* (2025.01); *H10D 48/383* (2025.01)

(58) Field of Classification Search
CPC ............ H01L 29/127; H01L 29/66977; H01L 29/205; H01L 29/7782; H01L 29/158;
(Continued)

(56) References Cited

U.S. PATENT DOCUMENTS

| 2007/0215860 A1 | 9/2007 | Komiyama et al. |
| 2017/0147939 A1 | 5/2017 | Dzurak et al. |
| 2019/0043952 A1 | 2/2019 | Thomas et al. |

OTHER PUBLICATIONS

Peterson et al.—"Charge and Spin State Readout of a Double Quantum Dot Coupled to a Resonator"—Nano Lett., 2010, 10 2789-2793 (Year: 2010).*
(Continued)

*Primary Examiner* — Syed I Gheyas
(74) *Attorney, Agent, or Firm* — Leydig, Voit & Mayer, Ltd.

(57) ABSTRACT

Semiconductor element, method of reading out a quantum dot device and system. The present document relates to a semiconductor element for providing a source reservoir for a charge sensor of a quantum dot device. The element comprises a semiconductor heterostructure (2, 3, 5) including a quantum well layer (5) contiguous to a semiconductor functional layer (3), one or more ohmic contacts (9) for providing charge carriers, and a first accumulation gate electrode (13) located opposite the quantum well layer and spaced apart therefrom at least by the semiconductor functional layer for enabling to form a two dimensional charge carrier gas (14) in a first area of the quantum well layer upon applying a first biasing voltage to the first accumulation gate electrode. The device further comprises a second accumulation gate electrode (17) opposite the quantum well layer and electrically isolated from the first accumulation gate electrode (13), the second accumulation gate electrode enabling to be biased with a second biasing voltage, for enabling to extend the two dimensional charge carrier gas in
(Continued)

a second area (18) contiguous to the first area. This document further relates to a method of determining a spin state in a quantum dot device, as well as a system comprising a quantum dot device and a semiconductor element.

18 Claims, 4 Drawing Sheets

(58) Field of Classification Search
CPC .............. H01L 29/165; H01L 29/4238; H01L 29/7613; H01L 29/42312; B82Y 10/00
See application file for complete search history.

(56) References Cited

OTHER PUBLICATIONS

European Patent Office, International Search Report in corresponding International Application No. PCT/NL2020/050501, dated Nov. 18, 2020 (3 pages).
Lim, Applied Physics Letters, 94, pp. 173502-173502 (2009) XP012121112.
Kuhlmann, Applied Physics Letters, 113, pp. 122107-1 to 122107-4 (2018) XP012231705.
Rossi, Applied Physic Letters, 110, pp. 212101-1 to 212101-5 (2017) XP012219095.
Volk, Nano Letters, 19, pp. 5628-5633 (2019) XP055658590.

* cited by examiner

SEMICONDUCTOR ELEMENT, METHOD OF READING OUT A QUANTUM DOT DEVICE AND SYSTEM

CROSS-REFERENCE TO RELATED APPLICATIONS

This patent application is a U.S. National Phase of PCT International Application No. PCT/NL2020/050501, filed Aug. 7, 2020, which claims priority to European Application No. 19190531.4, filed Aug. 7, 2019, which are both expressly incorporated by reference in their entireties, including any references contained therein.

FIELD OF THE INVENTION

The present invention is directed at a semiconductor element for providing a source reservoir for a charge sensor of a quantum dot device, comprising a semiconductor heterostructure including a quantum well layer contiguous to a semiconductor functional layer, one or more ohmic contacts for providing charge carriers, and a first accumulation gate electrode located opposite the quantum well layer and spaced apart therefrom at least by the semiconductor functional layer for enabling to form a two dimensional charge carrier gas in a first area of the quantum well layer upon applying a first biasing voltage to the first accumulation gate electrode.

The invention is further directed at a method of reading-out a spin state or charge state of a quantum dot device, wherein the quantum dot device comprises or is connected to a semiconductor element for providing a source reservoir for a charge sensor, the semiconductor element including: a semiconductor heterostructure including a quantum well layer contiguous to a semiconductor functional layer, one or more ohmic contacts, and a first accumulation gate electrode located opposite the quantum well layer and spaced apart therefrom at least by the semiconductor functional layer, wherein the method comprises: applying a first biasing voltage to the first accumulation gate electrode such as to form a two dimensional charge carrier gas in a first area of the quantum well layer; applying, using a radio frequency reflectometer circuit, a radio frequency signal to the accumulation gate of the quantum dot device; and analyzing a reflected part of the radio frequency signal such as to determine the spin state of the quantum dot device. Furthermore, the invention is directed at a system comprising a quantum dot device and a read-out circuit for determining the spin state of the quantum dot device.

BACKGROUND

Quantum computers are based on the manipulation of two-state (or two-level) quantum-mechanical systems that are referred to as qubits. Qubits may for example be provided by quantum dot devices, formed in semiconductor heterostructures which enable to create a spatially confined electron gas comprising electrons of which the spin states can be manipulated. To apply a quantum dot device successfully, is of great importance that it's present spin state may be read.

Earlier versions of quantum dot devices relied on a gallium arsenide (GaAs) heterostructure wherein a two-dimensional electron gas (2DEG) was formed at the interface between the GaAs quantum well layer and its neighboring functional layer (or layers), typically comprising aluminum gallium arsenide ($Al_xGa_{1-x}As$), and with electrons typically donated by a nearby dopant layer. The 2DEG is contained between depletion gates provided by biasing electrodes that locally deplete the interface using a negative biasing voltage. These types of devices are called depletion mode devices. However, unfavorable properties of these types of heterostructures has resulted the development of quantum dot devices based on silicon heterostructures. In addition to being abundant, silicon further has the benefit of providing stable spin states having a long lifetime. These types of quantum dot devices are based on the idea of accumulating a 2DEG in the silicon quantum well layer using a positively biased accumulation gate. Typical silicon quantum dot devices consists of layers of SiGe—Si—SiGe where in the silicon layer a 2DEG (two-dimension electron gas) is formed. Electrons in the 2DEG can be attracted or repulsed using metal gates (accumulation and depletion gates) on top of the sample. By tuning the voltages on the gates the amount of electrons in the 2DEG can be controlled, and quantum dots and charge sensors can be formed. A change in spin or charge state in the dot results in a change in resistance of the charge sensor, which can be measured by making the device part of a sensing circuit. These types of devices are called accumulation mode devices, since the 2DEG is not present until it is accumulated.

A common method for readout is radio frequency (RF) reflectometry using charge sensing. Charge sensing is the use of a conduction path to infer the number or location of nearby charges. The only requirement to be able to do this is that the conduction path be acutely sensitive to the local electrostatic environment, so that when an electron moves nearby (into or out of a quantum dot, or from one dot to another) the conductance of the path changes. In RF reflectometry, a high frequency signal (typically in the order of 100 MHz) is sent to a source reservoir (RF reservoir) of a charge sensor of the quantum dot device (the charge sensor is typically a quantum point contact or sensing dot) and the reflected signal is measured. The amplitude of the reflected signal is most often used, although the phase of the reflected signal contains information as well. The signal is reflected by an RLC resonator circuit (tank circuit) of which the resistor R consists of the charge sensor. The resistance of the charge sensor changes with the charge occupation of the quantum system and hence a change in the charge occupation can be measured by measuring the reflected signal. However, RF reflectometry in Si-based devices (or other accumulation-mode devices) has proven to be difficult.

A problem that typically complicates read-out of the spin or charge state in this manner, is that the capacitive coupling between the RF reservoir and the accumulation gate which is used to accumulate this reservoir complicates the read-out process.

SUMMARY OF THE INVENTION

It is an object of the present invention to provide a quantum dot device including a charge sensor arrangement, wherein the abovementioned disadvantages have been overcome and which enables accurate read-out.

To this end, there is provided herewith a semiconductor element for providing a source reservoir for a charge sensor of a quantum dot device, comprising a semiconductor heterostructure including a quantum well layer contiguous to a semiconductor functional layer, one or more ohmic contacts for providing charge carriers, and a first accumulation gate electrode located opposite the quantum well layer and spaced apart therefrom at least by the semiconductor functional layer for enabling to form a two dimensional charge carrier gas in a first area of the quantum well layer upon applying a first biasing voltage to the first accumulation gate electrode, wherein the device further comprises a second accumulation gate electrode opposite the quantum well layer and electrically isolated from the first accumulation gate electrode, the second accumulation gate electrode enabling to be biased with a second biasing voltage, for enabling to provide a further two dimensional charge carrier gas in a second area near the first area.

The further two dimensional charge carrier gas provided by the second accumulation gate may be an extension of the main two dimensional charge carrier gas provided by the first accumulation gate. Alternatively, it may be a different, additional two dimensional charge carrier gas. The further two dimensional charge carrier gas may thus be contiguous or adjacent the main two dimensional charge carrier gas.

The quantum dot device of the present invention has been improved over conventional similar devices by providing a second accumulation gate electrode that enables to extend the two-dimensional electron gas in the quantum well layer into a second area using a second biasing voltage. By controlling the second biasing voltage, the electron density in this second area can be independently controlled from the density in the first area underneath the first accumulation gate. As a result, this provides a second variable resistor on chip in the quantum dot device, the resistance of which can be controlled. By setting a low second biasing voltage, a low density is obtained resulting in a high resistance. Then the RF signal can be applied to the first accumulation gate, which would capacitively couple to the 2DEG reservoir underneath. This RF signal in this case will have only viable path through the charge sensor, as the current through the variable resistor to the ohmic contact is quenched by the high resistance of the second 2DEG. Resulting in the resonance frequency or amplitude of the reflected signal to be mainly dependent on the variable resistance of the primary charge sensor, i.e. formed by the first accumulation gate electrode over the 2D electron gas.

In the present description, the first accumulation gate is frequently referred to as the reservoir gate, because it serves to create the two dimensional (2D) electron gas that spatially confines the electrons of which the spin states or charge states can be manipulated. The second accumulation gate is in the present description frequently referred to as the lead gate which allows to form the further or extended 2D electron gas in the second area of the quantum well layer. As typically when applying the RF signal to the accumulation gate of the main 2DEG reservoir, the parasitic loss channel is formed between the main 2D electron gas and the ohmic contact, the second area preferably will be located between the main 2D electron gas and the ohmic contact (or contacts). The lead gate thereby enables to create the second variable resistor which enables to isolate the 2D electron gas from the Ohmic contact, thereby preventing the forming of the parasitic channel to ground. The skilled person will appreciate that a further 2D charge carrier gas provided using the second accumulation gate of the present invention may likewise be located anywhere else in the quantum well layer to prevent leak currents, parasitic channels or other losses.

Furthermore, the term two dimensional charge carrier gas particularly may be interpreted as a two dimensional electron gas, i.e. a reservoir of electrons held by a quantum well layer, or a two dimensional hole gas.

In some embodiments, the first accumulation gate electrode and the second accumulation gate electrode are arranged adjacent each other. In other or further embodiments, the first accumulation gate electrode and the second accumulation gate electrode at least partly overlap each other and are separated by an insulating layer. The accumulation gates in the above embodiments (both adjacently arranged and overlapping accumulation gates) are electrically isolated in order to allow independent control of their voltages, such as to establish different conditions in the first and second area of the 2D electron gas. Overlapping accumulation gates enable to extend the main two dimensional electron gas into the second area. The second area may be located between the first area and an Ohmic contact of the quantum dot device. Adjacently arranged accumulation gates are electrically isolated (e.g. by distance or by the presence of an insulator), the further two dimensional electron gas being formed adjacent the main two dimensional electron gas.

In some embodiments, the quantum dot device further comprises a first conductive path connecting to the first accumulation gate electrode, a second conductive path connecting to the second accumulation gate electrode, for enabling connecting of the first and second accumulation gate electrodes to at least one controller for applying the first and second biasing voltages such that the second biasing voltage is different from the first biasing voltage. The controller enables to set the first and the second biasing voltages differently, such as to enable the further two dimensional electron gas to provide a high resistance such as to prevent the forming of the parasitic capacitance.

Preferably, in accordance with some embodiments, the quantum dot device is an accumulation mode type quantum dot device. In some embodiments, the quantum well layer is at least one of a silicon layer, germanium layer, indium arsenide layer, indium antimonide layer, graphene layer, or a gallium arsenide layer. For example in some embodiments, at least one of the quantum well layer comprises a silicon layer and the functional layer comprises at least one of a silicon germanium layer or a silicon oxide layer. In some embodiments, the quantum well layer is formed a silicon layer in between two functional layers, wherein the functional layers are provided by silicon germanium layers. In some embodiments, the quantum well layer is a gallium arsenide layer and the functional layer is an aluminum gallium arsenide layer, such as $Al_xGa_{1-x}As$ wherein $0<x<1$. In some embodiments, the quantum well layer is formed a germanium layer in between two functional layers, wherein the functional layers are provided by silicon germanium layers. In some embodiments, the quantum well layer is formed a single or multilayer graphene layer in between two functional layers, wherein the functional layers are provided by boron nitride layers. The skilled person will appreciate that the present invention may usefully be applied in other types and designs of quantum dot devices. Therefore, the mentioning of specific types of quantum dot devices is not to be considered as limiting on the invention.

In accordance with a second aspect of the invention, there is provided a method of reading-out a spin state in a quantum dot device, wherein the quantum dot device comprises a semiconductor heterostructure including a quantum well layer contiguous to a semiconductor functional layer, one or more ohmic contacts, and a first accumulation gate electrode located opposite the quantum well layer and spaced apart therefrom at least by the semiconductor functional layer, wherein the method comprises: applying a first biasing voltage to the first accumulation gate electrode such as to form a two dimensional charge carrier gas in a first area of the quantum well layer; applying, using a radio frequency reflectometer circuit, a radio frequency signal via the first accumulation gate to the two dimensional charge carrier gas of the quantum dot device; and analyzing a reflected part of the radio frequency signal such as to determine the spin state of the quantum dot device; wherein the method further comprises: applying a second biasing voltage to a second accumulation gate electrode such as to provide a further two dimensional charge carrier gas in a second area near the first area, wherein the second accumulation gate electrode is arranged opposite the quantum well layer and electrically isolated from the first accumulation gate electrode.

In some embodiments, the second biasing voltage is different from the first biasing voltage such as to provide the two dimensional electron gas in the first and second area having different electron densities. For example, in some embodiments, the second biasing voltage is smaller than the first biasing voltage such as to provide the two dimensional electron gas in the second area having smaller electron density than in the first area. The resistivity of the further two dimensional electron gas will therefore be larger than for the main two dimensional electron gas.

In some embodiments, the radio frequency reflectometer circuit is an RLC type resonator circuit, and wherein the quantum dot device forms a variable resistor element which is connected in parallel to a capacitor and resistor of the RLC type resonator circuit.

In accordance with a third aspect, the invention provides a system comprising a quantum dot device according to the first aspect and a read-out circuit for determining the spin state of the quantum dot device, wherein the read-out out circuit comprises lead line for applying a radio frequency signal to the first accumulation gate of the quantum dot device, and a resonator circuit, and wherein the quantum dot device forms a variable resistance that is part of the resonator circuit, the system further comprising an analyzer, connected to the resonator circuit, for analyzing a reflected part of the radio frequency signal such as to determine the spin state of the quantum dot device, and at least one controller for applying the first and second biasing voltages to the first and second accumulation gate electrodes respectively such that the second biasing voltage is different from the first biasing voltage.

BRIEF DESCRIPTION OF THE DRAWINGS

The invention will further be elucidated by description of some specific embodiments thereof, making reference to the attached drawings. The detailed description provides examples of possible implementations of the invention, but is not to be regarded as describing the only embodiments falling under the scope. The scope of the invention is defined in the claims, and the description is to be regarded as illustrative without being restrictive on the invention. In the drawings:

DETAILED DESCRIPTION

A key component for quantum computers (and quantum devices in general) is readout of the spin- or charge state of the system. This is achieved using a quantum dot device, and a common method for its readout is high frequency or radio frequency (RF) reflectometry. In RF reflectometry a high frequency signal (typically in the order of 100 MHz) is send to the charge sensor of the quantum dot device (the charge sensor is typically a quantum point contact (QPC) or sensing dot) and the reflected signal is measured. For this, use is often made of an RLC resonance circuit (tank circuit) of which the resistor R consists of the charge sensor. The resistance of the charge sensor changes with the charge occupation of the quantum system. By making the charge sensor part of the tank circuit, the amplitude and phase of the reflected signal from the RLC circuit may be made dependent on the charge occupation of the charge sensor. Hence a change in the charge occupation can be measured by measuring the reflected signal. Most often the amplitude of the reflected signal is used, although the phase of the reflected signal contains useful information as well.

Figure 1:
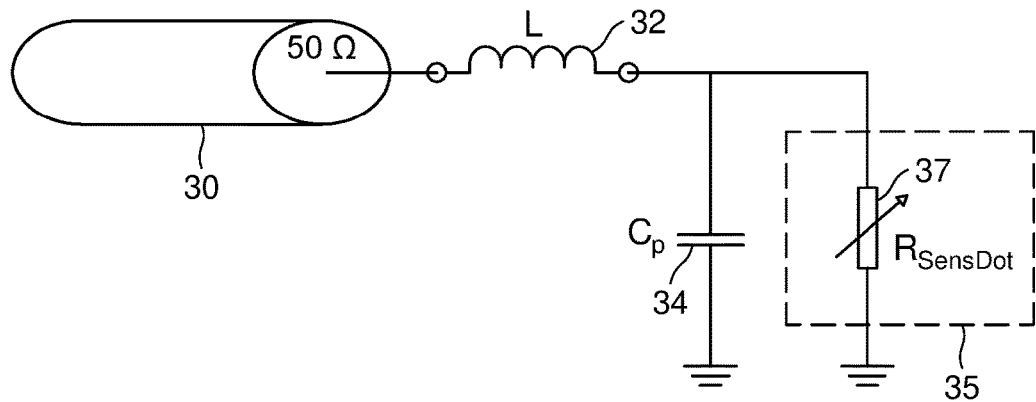
FIG. 1 illustrates an ideal case circuit scheme for reading out a quantum dot device.

FIG. 1 schematically illustrates an idealized readout circuit, consisting of an incoming 50Ω (Ohm) transmission line 30 connected to an inductor L 32. An ohmic contact of the quantum dot device 35 is connected in series with the inductor 32. The inductor 32 and the electrodes connecting the inductor to the quantum dot device 35, have a capacitance $C_P$ 34 to ground. Matching of the inductance L and the capacitance $C_P$ to the resistance $R_{SensDot}$ enables the impedance of the system to change significantly in response to a change in $R_{SensDot}$. A change in the resistance $R_{SensDot}$ 37 of the charge sensor in the quantum dot device 35 then results in a change in the resonance frequency of the circuit, which in turn has its effect on the amplitude and phase of the reflected signal. The RF readout circuit illustrates may be realized in depletion-mode quantum dot devices, i.e. in devices where two dimensional charge carrier gas is present because of nearby donors or acceptors, and does not need to be accumulated.

As explained before, silicon based quantum dot devices nowadays form a popular class of quantum dot devices, due to the fact that the earlier GaAs heterostructure based spin qubits could not remain coherent for a long time, because of the nuclear spins of Gallium (Ga) and Arsenide (As). The most abundant isotopes of Silicon (Si) and Germanium (Ge) have a nuclear spin I=0 (no spin) and may be isotopically purified. Typical Si quantum dot devices consists of layers of SiGe—Si—SeGe where in the Si layer a two-dimension electron gas (2DEG) is formed. Electrons in the 2D electron gas can be attracted or repulsed using metal gates (accumulation and depletion gates) on top of the sample. By tuning voltages on the gates, a 2DEG can be formed and shaped to create a charge sensor with 2DEG source and drain leads.

However, application of RF readout to silicon devices has proved to be difficult so far. One of the reasons is that the presence of an accumulation gate above the 2DEG reservoir forms a second capacitor $C_{Accgate}$ which draws RF current through a contact resistance between 2DEG and ohmic contact $R_{contact}$ and dissipates power. This has been schematically illustrated in FIG. 2, which shows a circuit scheme for reading out a quantum dot device 35 illustrating a non-idealized normal behavior of the device 35 in a system.

Figure 2:
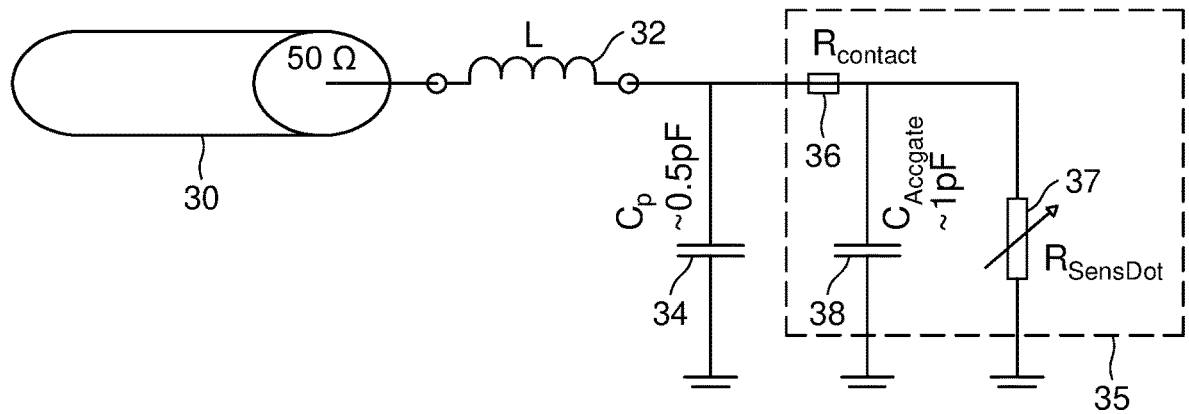
FIG. 2 illustrates a circuit scheme for reading out a quantum dot device illustrating a non-idealized normal behavior of an accumulation-mode device in a system.

In FIG. 2, the quantum dot device 35 is considered to be a Si based quantum dot device, consisting of a 2D silicon quantum well layer between two layers of SiGe. FIG. 2 is a circuit scheme that schematically illustrates a normal, non-idealized, behavior of the quantum dot device 35 in a readout circuit Again, capacitor $C_P$ 34 forms the capacitance of the tank circuit. The replacement scheme for the device 35 is shown in the dashed box of FIG. 2 (as in FIG. 1). The figure illustrates the charge sensor resistance 37 $R_{SensDot}$, but in addition to this it also illustrates a parasitic capacitance 38 with value $C_{Accgate}$ parallel to the resistance 37 ($R_{SensDot}$). The parasitic capacitance 38 degrades the performance of the circuit, as it draws current through the contact resistance 36 $R_{contact}$ and reduces quality factor Q.

Figure 3A:
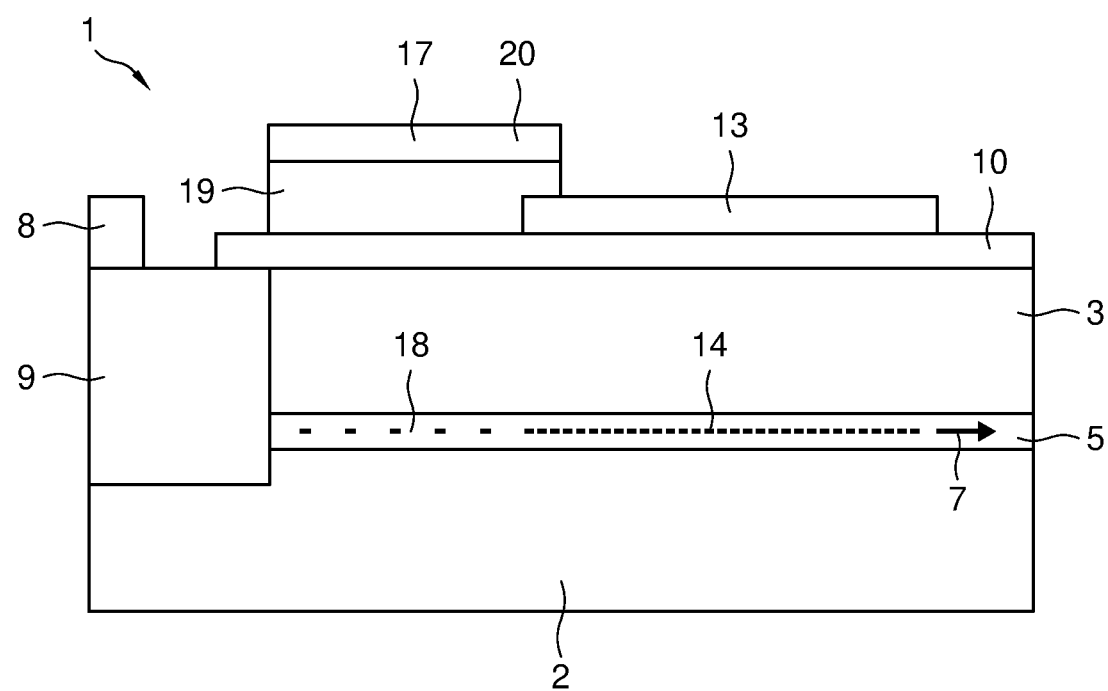
FIGS. 3A and 3B schematically illustrate the 2DEG RF reservoir of the charge sensor of a quantum dot device in accordance with a first embodiment.
Figure 3B:
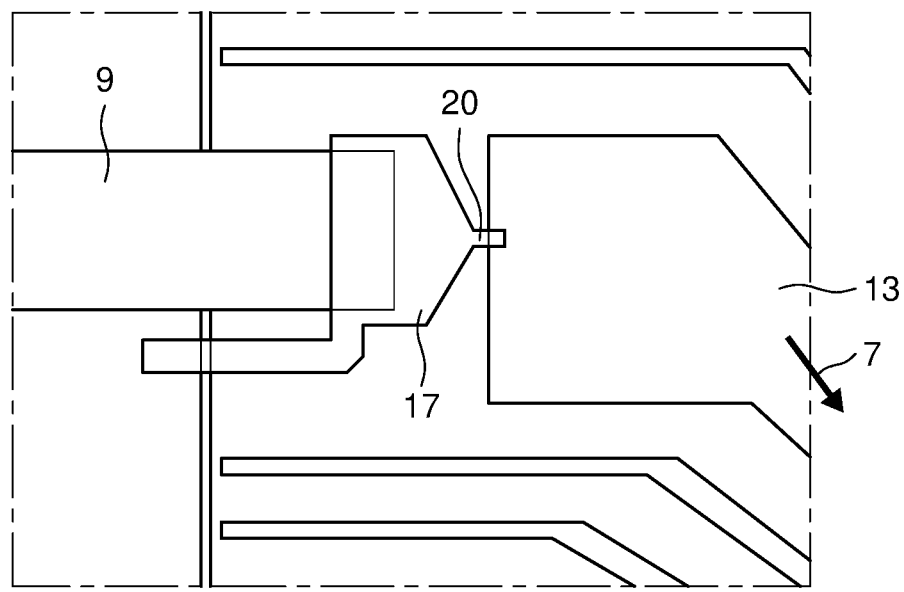

A quantum dot device 1 in accordance with an embodiment of the present invention is schematically illustrated in FIGS. 3A and 3B. These figures illustrate a silicon heterostructure, consisting of a silicon quantum well layer 5 between layers 2 and 3 of SiGe. The quantum well layer 5 has the ability to locally trap electrons. To this end, as illustrated in FIG. 3A, accumulation gate 13 (or reservoir gate) located above aluminumoxide (AlO$_x$) layer 10 changes the local potential in the quantum well layer 5, and thereby traps electrons within the quantum well layer 5. These electrons form a two dimensional electron gas 14 located underneath the accumulation gate 13. The 2D electron gas is thus formed in a first area of the quantum well layer 5 underneath the accumulation gate 13. An electrode 8 connects to an n-type Ohmic contact 9 in the heterostructure 1.

In accordance with the present invention, an additional accumulation gate 17 (or lead gate) is present above the quantum well layer 5 in the area between the Ohmic contact 9 and the first area where the main 2D electron gas is formed. The lead gate 17 is, in the shown embodiment, electrically separated from the reservoir gate 13 by a silicon nitride (SiN) layer 19. In this embodiment, the lead gate 17 at least partly overlaps the reservoir gate 13. FIG. 3B shows part of the heterostructure in top view. The lead gate 17, in accordance with this embodiment, in a small part thereof overlaps the reservoir gate 13 via a bridge 20.

The lead gate 17 is biased at a different voltage than the reservoir gate 13, and in a second area of the quantum well layer 5 underneath the gate 13 forms a further two dimensional electron gas 18. The 2D electron gas 18 may be considered an additional electron gas or an extension of the main 2D electron gas 14. The bridge 20 of the lead gate is advantageous in creating a constriction where the resistance of the 2DEG can be made high. The electron density in the additional 2D electron gas may be controlled by controlling the biasing voltage on the lead gate 17, and as a result the electron density can be set such that it provides a high resistivity between the main 2D electron gas 14 and the Ohmic contact 9. This in turn prevents a power leakage channel to the Ohmic contact to be formed when the tank circuit is connected to the accumulation gate, because it quenches the current substantially in this second area, i.e. the area underneath the lead gate 17.

Figure 6:
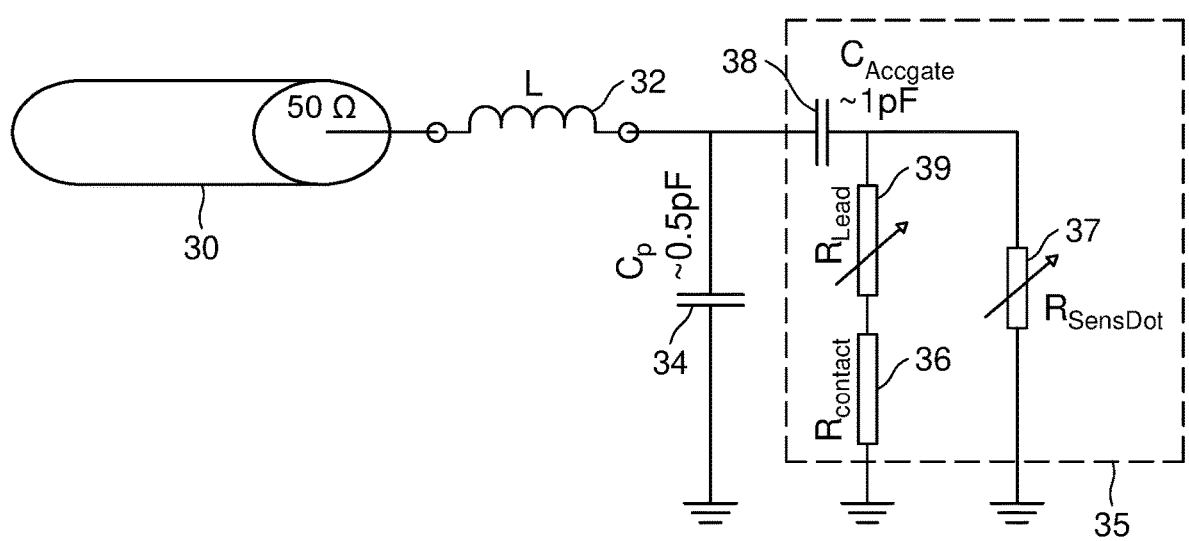
FIG. 6 illustrates a circuit scheme for reading out a quantum dot device in accordance with an embodiment of the invention.

FIG. 6 illustrates a circuit in accordance with an embodiment of the invention, for reading out a state of quantum dot device 35. Here, the inductor 32 is connected to the accumulation gate 13, so that the capacitance 38 of value $C_{Accgate}$ is now in series with the resistance 37 ($R_{SensDot}$), and the contact resistance 36 ($R_{contact}$) is in parallel with $R_{SensDot}$ 37. Varying the accumulation voltage on the additional lead gate 17 between the main accumulation gate 13 and the ohmic contact 8 results in a variable resistance 39 of value $R_{Lead}$, in series with contact resistance 36 ($R_{contact}$). Making this lead resistance 39 $R_{Lead}$ much larger than $R_{SensDot}$ 37, current through this channel is suppressed, effectively obtaining the ideal circuit shown in FIG. 1, provided that capacitance 38 ($C_{Accgate}$) is sufficiently large.

Comparing the circuit of FIG. 6 with the embodiment depicted in FIGS. 3A and 3B, the accumulation gate capacitance 38 ($C_{Accgate}$ in FIG. 6) is the capacitance between 2DEG 14 and main accumulation gate 13, resistance 39 $R_{Lead}$ is the resistance of the additional 2DEG 18, $R_{Contact}$ is the contact resistance between Ohmic contact 9 and the additional 2DEG 18. In the FIGS. 3A and 3B the path to the charge sensor is indicated by arrow 7, the charge sensor itself is not visible in the figures. Resistance 37 with value $R_{SenseDot}$ in FIGS. 1-3 represents the charge sensor in the circuit diagrams. The present invention is based on the insight that, in absence of preventive measures, there is always an additional channel for RF signal to leak before getting to the charge sensor (not pictured). If the inductor 32 were to be connected to the Ohmic contact 9, the second channel would be through the accumulation gate capacitance 38. And vice-versa, if the inductor 32 were to be connected to the accumulation gate 13, the second channel would be through the Ohmic contact 9.

Referring to FIGS. 3A and 3B again, as described, the biasing voltages on the lead gate 17 and the reservoir gate 13 may be independently set to a different voltage to allow setting the electron density and resistivity in the 2D electron gas 18 independently from the electron density in the main 2D electron gas 14. For example, in some embodiments the voltages applied to the lead gate 17 and reservoir gate 13 may be independently controlled using a controller (not illustrated) connected to the gates 13 and 17.

Figure 4A:
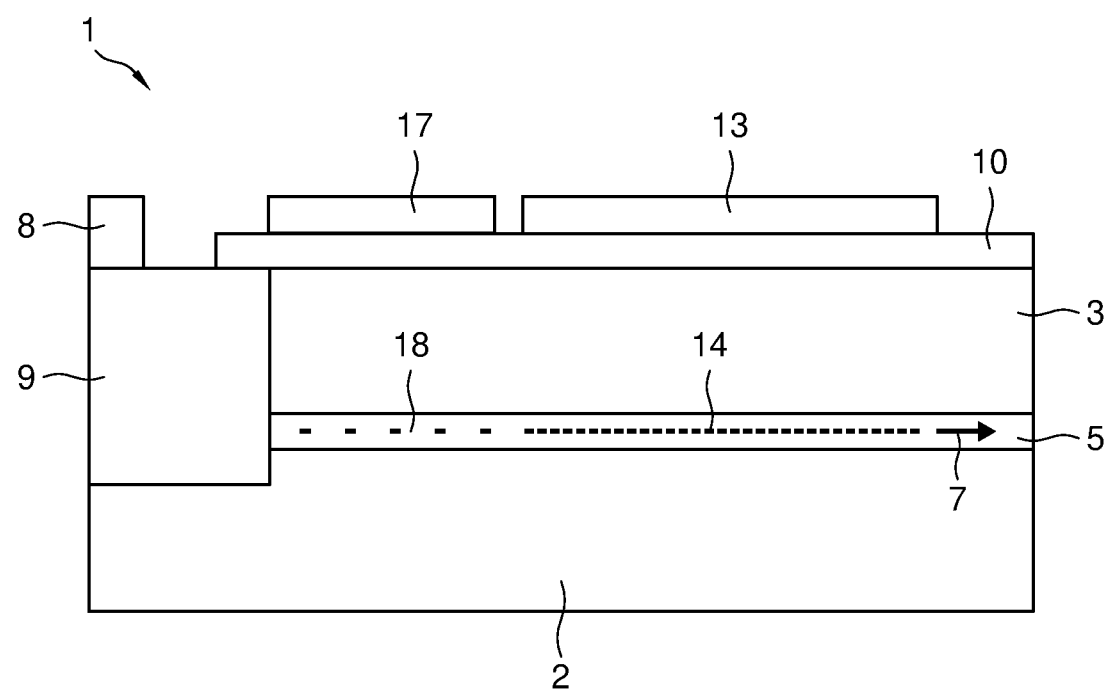
FIGS. 4A and 4B schematically illustrate the 2DEG RF reservoir of the charge sensor of a quantum dot device in accordance with a second embodiment.
Figure 4B:
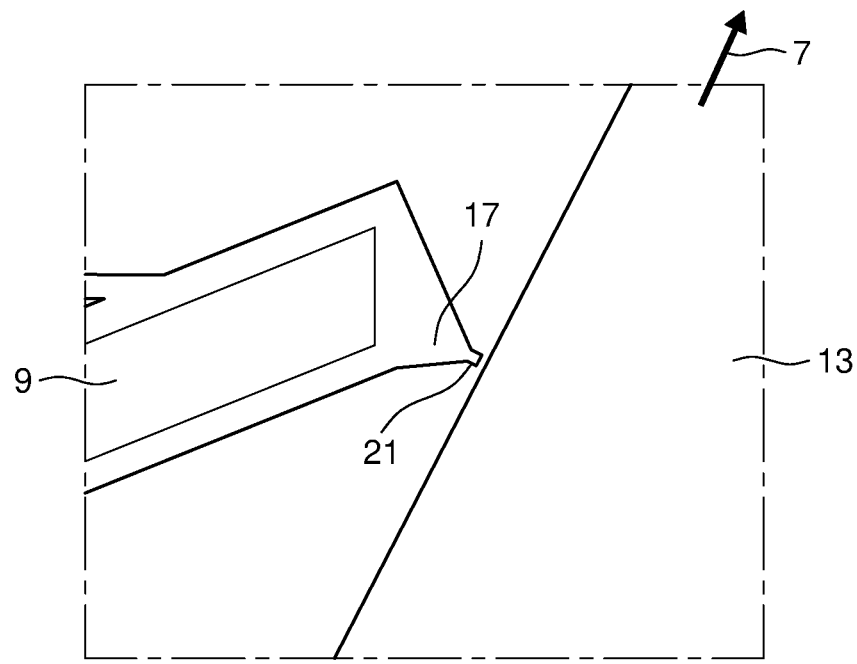

A further embodiment is illustrated in FIGS. 4A and 4B. The working of the heterostructure 1 FIGS. 4A and B is almost identical to that of FIGS. 3A and 3B, but the difference is that the lead gate 17 is not overlapping the reservoir gate 13. Preferably, as illustrated in FIG. 4B, the lead gate 17 comprises a finger portion 21 that extends towards the reservoir gate 13, enabling tunneling through the quantum well layer 5 into the second area and into the additional 2D electron gas. The lead gate 17 and reservoir gate 13, as is visible in FIGS. 4A and 4B, are located adjacent each other and are not separated by an additional isolating layer (e.g. like the SiN layer in FIG. 3A). However, an isolator may be present in between gates 13 and 17 in some embodiments to prevent undesired leak currents in case these may be experienced.

Figure 5:
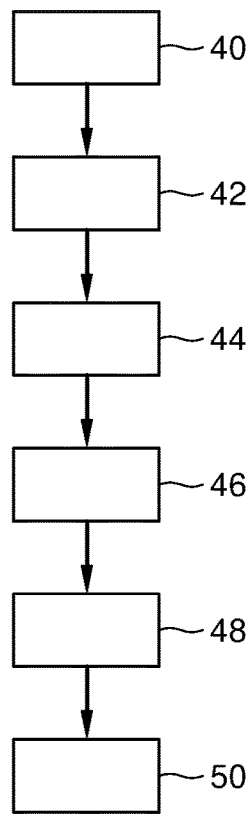
FIG. 5 schematically illustrate a method according to an embodiment of the invention.

FIG. 5 further schematically illustrates a method in accordance with the present invention. The method may be applied to read-out a quantum dot device of the present invention, e.g. any of the devices or embodiments described above including a lead gate. In FIG. 5, in step 40 a first biasing voltage is applied to the first accumulation gate electrode 13 such as to form a two dimensional electron gas 14 in a first area of the quantum well layer 5. In step 42, a second biasing voltage is applied to the second accumulation gate electrode 17 such as to provide the additional two dimensional electron gas 18 in a second area contiguous to the first area. As described, the second accumulation gate electrode 17 is arranged opposite the quantum well layer 5 and electrically isolated from the first accumulation gate electrode 18 either by an isolator material or by air. Then, in step 44, using a radio frequency reflectometer circuit e.g. such as illustrated in FIGS. 1 and 2, a radio frequency signal to accumulation gate 13 of the 2DEG reservoir of the quantum dot device 1 is applied. The signal may be of a frequency of 100 megahertz, but could be at any desired frequency between e.g. 20 megahertz and 5 gigahertz. The output signal, the reflected signal received in response, is to be analyzed such as to determine the resistance of the charge sensor, and subsequently spin or charge state of the quantum dot device 1. Thereto, in step 46, the amplitude may be measured and in step 48 the phase may be measured. In principle steps 46 and 48 are optional as long as at least one of these steps (measuring the amplitude or measuring the phase) will be carried out. Based on this measurement, in step 50 the analysis is performed such as to determine the spin or charge state.

The present invention has been described in terms of some specific embodiments thereof. It will be appreciated that the embodiments shown in the drawings and described herein are intended for illustrated purposes only and are not by any manner or means intended to be restrictive on the invention. It is believed that the operation and construction of the present invention will be apparent from the foregoing description and drawings appended thereto. It will be clear to the skilled person that the invention is not limited to any embodiment herein described and that modifications are possible which should be considered within the scope of the appended claims. Also kinematic inversions are considered inherently disclosed and to be within the scope of the invention. Moreover, any of the components and elements of the various embodiments disclosed may be combined or may be incorporated in other embodiments where considered necessary, desired or preferred, without departing from the scope of the invention as defined in the claims.

In the claims, any reference signs shall not be construed as limiting the claim. The term 'comprising' and 'including' when used in this description or the appended claims should not be construed in an exclusive or exhaustive sense but rather in an inclusive sense. Thus the expression 'comprising' as used herein does not exclude the presence of other elements or steps in addition to those listed in any claim. Furthermore, the words 'a' and 'an' shall not be construed as limited to 'only one', but instead are used to mean 'at least one', and do not exclude a plurality. Features that are not specifically or explicitly described or claimed may be additionally included in the structure of the invention within its scope. Expressions such as: "means for . . . " should be read as: "component configured for . . . " or "member constructed to . . . " and should be construed to include equivalents for the structures disclosed. The use of expressions like: "critical", "preferred", "especially preferred" etc. is not intended to limit the invention. Additions, deletions, and modifications within the purview of the skilled person may generally be made without departing from the spirit and scope of the invention, as is determined by the claims. The invention may be practiced otherwise then as specifically described herein, and is only limited by the appended claims.

The invention claimed is:

1. A semiconductor element for providing a source reservoir for a charge sensor of a quantum dot device, the semiconductor element comprising:
   a semiconductor heterostructure including:
      a semiconductor functional layer,
      a quantum well layer contiguous to the semiconductor functional layer,
      one or more ohmic contacts for providing charge carriers, and
      a first accumulation gate electrode that is located at a side of the semiconductor functional layer opposite the quantum well layer and that is spaced apart from the quantum well layer at least by the semiconductor functional layer, the first accumulation gate electrode enabling forming a two-dimensional charge carrier gas in a first area of the quantum well layer upon applying a first biasing voltage to the first accumulation gate electrode; and
   a second accumulation gate electrode that is located at a side of the semiconductor functional layer opposite the quantum well layer and that is electrically isolated from the first accumulation gate electrode,
      wherein the second accumulation gate electrode is configured to be biased with a second biasing voltage to extend forming the two-dimensional charge carrier gas into a second area of the quantum well layer that is contiguous to the first area.

2. The semiconductor element according to claim 1, wherein the first accumulation gate electrode and the second accumulation gate electrode are arranged adjacent each other.

3. The semiconductor element according to claim 1, wherein the first accumulation gate electrode and the second accumulation gate electrode partly overlap each other, and
   wherein the first accumulation gate electrode is separated from the second accumulation gate electrode by an insulating layer.

4. The semiconductor element according to claim 1, further comprising:
   a first conductive path connecting to the first accumulation gate electrode,
   a second conductive path connecting to the second accumulation gate electrode,
   wherein the first conductive path and the second conductive path enable connecting of the first accumulation gate and the second accumulation gate electrode, respectively, to at least one controller for applying the first biasing voltage and the second biasing voltage, respectively, so that the second biasing voltage can differ from the first biasing voltage.

5. The semiconductor element according to claim 1, wherein the quantum dot device is an accumulation mode type quantum dot device.

6. The semiconductor element according to claim 1, wherein the quantum well layer is at least one of a silicon layer or a gallium arsenide layer.

7. The semiconductor element according to claim 6, wherein at least one of:
   the quantum well layer comprises a silicon layer and the functional layer comprises at least one of a silicon germanium layer or a silicon oxide layer; or
   the quantum well layer is formed a silicon layer in between two functional layers, wherein the functional layers are provided by silicon germanium layers; or
   the quantum well layer is a gallium arsenide layer and the functional layer is an aluminum gallium arsenide layer, such as $Al_xGa_{1-x}As$ wherein $0<x<1$.

8. A method of reading-out a spin state or charge state of a quantum dot device, wherein the quantum dot device comprises or is connected to a semiconductor element for providing a source reservoir for a charge sensor, the semiconductor element including:
   a semiconductor heterostructure including:
      a semiconductor functional layer,
      a quantum well layer contiguous to the semiconductor functional layer,
      one or more ohmic contacts,
      a first accumulation gate electrode that is located at a side of the semiconductor functional layer opposite the quantum well layer and that is spaced apart from the quantum well layer at least by the semiconductor functional layer, and a second accumulation gate electrode that is located at a side of the semiconductor functional layer opposite the quantum well layer and that is electrically isolated from the first accumulation gate electrode, wherein the method comprises:

applying a first biasing voltage to the first accumulation gate electrode so as to form a two-dimensional charge carrier gas in a first area of the quantum well layer;

applying, using a radio frequency reflectometer circuit, a radio frequency signal to the accumulation gate of the quantum dot device;

analyzing a reflected part of the radio frequency signal such as to determine the spin state of the quantum dot device; and applying a second biasing voltage to the second accumulation gate electrode so as to extend forming the two-dimensional charge carrier gas into a second area of the quantum well layer that is contiguous to the first area.

9. The method according to claim 8, wherein the second biasing voltage is different from the first biasing voltage such as to provide the two dimensional electron gas in the first and second area having different electron densities.

10. The method according to claim 9, wherein the second biasing voltage is smaller than the first biasing voltage such as to provide the two dimensional electron gas in the second area having smaller electron density than in the first area.

11. The method according to claim 8, wherein the radio frequency reflectometer circuit is an RLC type resonator circuit, and wherein the quantum dot device forms a variable resistor element which is connected in parallel to a capacitor of the RLC type resonator circuit.

12. A system comprising:
a semiconductor element comprising:
a semiconductor heterostructure including:
a semiconductor functional layer,
a quantum well layer contiguous to the semiconductor functional layer,
one or more ohmic contacts for providing charge carriers, and
a first accumulation gate electrode that is located at a side of the semiconductor functional layer opposite the quantum well layer and that is spaced apart from the quantum well layer at least by the semiconductor functional layer, the first accumulation gate electrode enabling forming a two-dimensional charge carrier gas in a first area of the quantum well layer upon applying a first biasing voltage to the first accumulation gate electrode; and
a second accumulation gate electrode that is located at a side of the semiconductor functional layer opposite the quantum well layer and that is electrically isolated from the first accumulation gate electrode,
wherein the second accumulation gate electrode is configured to be biased with a second biasing voltage to extend forming the two-dimensional charge carrier gas into a second area of the quantum well layer that is contiguous to the first area,
a quantum dot device, and
a read-out circuit for determining the spin state or charge state of the quantum dot device, wherein the read-out out circuit comprises:
a lead line for applying a radio frequency signal to one or more of the ohmic contacts of the quantum dot device, and
a resonator circuit,
wherein the quantum dot device forms a variable resistance that is part of the resonator circuit,
wherein the system further comprises:
an analyzer connected to the resonator circuit, wherein the analyzer is configured for analyzing a reflected part of the radio frequency signal to determine the spin state of the quantum dot device, and
at least one controller for applying the first biasing voltage and the second biasing voltage to the first accumulation gate electrode and the second accumulation gate electrode, respectively, wherein the second biasing voltage is different from the first biasing voltage.

13. The system according to claim 12, wherein the first accumulation gate electrode and the second accumulation gate electrode are arranged adjacent each other.

14. The system according to claim 12, wherein the first accumulation gate electrode and the second accumulation gate electrode partly overlap each other, and
wherein the first accumulation gate electrode is separated from the second accumulation gate electrode by an insulating layer.

15. The system according to claim 12, further comprising:
a first conductive path connecting to the first accumulation gate electrode,
a second conductive path connecting to the second accumulation gate electrode,
wherein the first conductive path and the second conductive path enable connecting of the first accumulation gate and the second accumulation gate electrode, respectively, to at least one controller for applying the first biasing voltage and the second biasing voltage, respectively, so that the second biasing voltage can differ from the first biasing voltage.

16. The system according to claim 12, wherein the quantum dot device is an accumulation mode type quantum dot device.

17. The system according to claim 12, wherein the quantum well layer is at least one of a silicon layer or a gallium arsenide layer.

18. The system according to claim 17, wherein at least one of:
the quantum well layer comprises a silicon layer and the functional layer comprises at least one of a silicon germanium layer or a silicon oxide layer; or
the quantum well layer is formed a silicon layer in between two functional layers, wherein the functional layers are provided by silicon germanium layers; or
the quantum well layer is a gallium arsenide layer and the functional layer is an aluminum gallium arsenide layer, such as $Al_xGa_{1-x}As$ wherein $0<x<1$.

* * * * *